(12) United States Patent
Oinonen et al.

(10) Patent No.: US 10,985,751 B2
(45) Date of Patent: Apr. 20, 2021

(54) DETERMINING AND COMPENSATING POWER TRANSISTOR DELAY IN PARALLEL HALF BRIDGE LEGS

(71) Applicant: ABB Schweiz AG, Baden (CH)

(72) Inventors: Markus Oinonen, Helsinki (FI); Jaakko Tuomainen, Helsinki (FI); Kari Maula, Helsinki (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/247,112

(22) Filed: Jan. 14, 2019

(65) Prior Publication Data
US 2019/0222210 A1    Jul. 18, 2019

(30) Foreign Application Priority Data

Jan. 12, 2018 (EP) .................................... 18151393

(51) Int. Cl.
*H02M 7/537* (2006.01)
*H03K 17/567* (2006.01)
(Continued)

(52) U.S. Cl.
CPC .......... *H03K 17/567* (2013.01); *H02M 1/088* (2013.01); *H02M 7/537* (2013.01); *H02M 7/493* (2013.01)

(58) Field of Classification Search
CPC .... H02M 7/537; H02M 7/5387; H02M 7/538; H02M 7/53806; H02M 7/5381; H02M 7/5383; H02M 7/53832; H02M 7/53835
See application file for complete search history.

(56) References Cited

U.S. PATENT DOCUMENTS 6,018,154 A * 1/2000 Izaki ..................... H02M 7/537
219/625
8,760,891 B2 * 6/2014 Lloyd ..................... H03K 17/18
363/56.04
(Continued)

FOREIGN PATENT DOCUMENTS

CN    1117670 A    2/1996
CN    1639978 A    7/2005
(Continued)

OTHER PUBLICATIONS

European Patent Office, Search Report issued in corresponding Application No. 18151393.8, dated Jul. 6, 2018, 2 pages.
(Continued)

*Primary Examiner* — Thienvu V Tran
*Assistant Examiner* — Nusrat Quddus
(74) *Attorney, Agent, or Firm* — Taft Stettinius & Hollister LLP

(57) ABSTRACT

A method and an apparatus for determining switching delay times of power semiconductor switch components in parallel connected half bridge legs in which two or more power semiconductor switches are controlled in parallel. The method includes providing a gate control signal to gate drivers of the parallel connected power semiconductor switch components, determining collector to emitter voltages of the parallel connected power semiconductor switch components, and determining separate delay times for each of the parallel connected power semiconductor switch components based on the time instant of the gate control signal and the determined collector to emitter voltages or time derivatives of the determined collector to emitter voltages.

12 Claims, 12 Drawing Sheets

(51) Int. Cl.
*H02M 1/088* (2006.01)
*H02M 7/493* (2007.01)

(56) References Cited

U.S. PATENT DOCUMENTS

| | | | | |
|---|---|---|---|---|
| 9,214,873 | B2* | 12/2015 | Jakob | H02M 1/32 |
| 2001/0017783 | A1* | 8/2001 | Bruckmann | H03K 17/0828 |
| | | | | 363/97 |
| 2005/0063124 | A1* | 3/2005 | Lundberg | H03K 17/0828 |
| | | | | 361/111 |
| 2008/0088379 | A1 | 4/2008 | Chen | |
| 2011/0234185 | A1* | 9/2011 | Nagase | H03K 17/0822 |
| | | | | 323/277 |
| 2015/0155700 | A1* | 6/2015 | Alvarez Valenzuela | |
| | | | | H03K 17/0822 |
| | | | | 361/93.9 |
| 2015/0168484 | A1* | 6/2015 | Ratz | G01R 31/2608 |
| | | | | 327/109 |
| 2017/0187277 | A1 | 6/2017 | Szczesny et al. | |

FOREIGN PATENT DOCUMENTS

| | | |
|---|---|---|
| CN | 102377325 A | 3/2012 |
| CN | 102638192 A | 8/2012 |
| CN | 104078939 A | 10/2014 |
| CN | 104795977 A | 7/2015 |
| CN | 106537777 A | 3/2017 |
| CN | 106887967 A | 6/2017 |
| DE | 102004049162 A1 | 4/2006 |
| EP | 1187305 A | 3/2002 |
| EP | 2164157 A | 3/2010 |
| EP | 3125431 A | 2/2017 |
| JP | 2014090316 A | 5/2014 |

OTHER PUBLICATIONS

Alvarez et al., "Sinusoidal Current Operation of Delay-Time Compensation for Parallel-Connected IGBTs," IEEE Transactions on Industry Applications, vol. 50, No. 5, Sep./Oct. 2014, pp. 3485-3493.

Bortis et al., "Active Gate Control for Current Balancing in Parallel Connected IGBT Modules in Solid State Modulators," Pulsed Power Plasma Science Conference, Jun. 17, 2008, pp. 1323-1326.

Bortis et al., "Double-Stage Gate Drive Circuit for Parallel Connected IGBT Modules," IEEE International Power Modulators and High Voltage Conference, May 27, 2008, Piscataway, New Jersey, pp. 388-391.

China National Intellectual Property Administration, First Office Action issued in corresponding Chinese application No. 201910016876.8, dated Jul. 3, 2020, 25 pages.

* cited by examiner

# DETERMINING AND COMPENSATING POWER TRANSISTOR DELAY IN PARALLEL HALF BRIDGE LEGS

FIELD OF THE INVENTION

The present invention relates to control of power semiconductor component, and particularly to determining switching delays of power semiconductor components.

BACKGROUND OF THE INVENTION

Power semiconductor components are used typically in applications in which high currents and voltages are switched. An example of a device employing power semiconductor components as switches is an inverter. In a voltage source inverter a positive or a negative voltage is connected to a load using power semiconductors. In some occasions, power semiconductors are connected in parallel such that the components are operated simultaneously and the components share a common load current. Components may be paralleled, for example, if the current rating of a single component would not be high enough for the load current.

In parallel operation of power transistors, such as IGBTs (insulated-gate bipolar transistor), the difference in switching delay times causes current imbalance between the parallel legs. In case of parallel connected half bridge legs, such as shown in FIG. 1, the current difference $\Delta i = i_1 - i_2$ depends on the voltage $U_{DC}$, the inductance between the phases $L_{12} = L_1 + L_2$ and the switching time difference $\Delta t$ as shown in equation (1). The ideal switches of FIG. 1 are controlled complementarily and the $\Delta t$ denotes the time difference between the instants when the half bridge middle points change the state from UDC+ to UDC− or vice versa.

$$\Delta i = \frac{\Delta t U_{DC}}{L_{12}} \quad (1)$$

With actual devices, the properties of the used power semiconductors may dominate the $\Delta t$, particularly if components from different vendors are used simultaneously. For IGBT components the switching delay times are defined in IEC 60747-9: "Semiconductor devices—Discrete devices Part 9: Insulated-gate bipolar transistors (IGBTs)", 2007. According to the definition turn-on delay $t_{d-on}$ is defined to be the time period from the instant when gate to emitter voltage $U_{GE}$ exceeds 10% of its full value to the time instant when the collector current $I_C$ has risen to 10% of its nominal value. Turn-off delay$_{td-off}$ is defined as the time period from the time instant when the gate voltage drops to 90% of its full value to the time instant when the collector current drops to 90% of its nominal value.

The primary quantity defining the conduction state of IGBT is the collector current. The component is clearly in the conduction state when the current is flowing through the component, and on the other hand, when the collector current is not flowing, the component is in the blocking state.

It is known to compensate for the switching delays and one solution is presented in document Álvarez R, "*Characterization of New Press-Pack IGBTs and Automated Delay Time Compensation of Parallel Connected IGBTs*", Dissertation Technische Universität Dresden (2011). In the solution, the delay time is calculated by using the parasitic inductance of a power module or component as di/dt sensing element. By measuring the voltage over the parasitic inductance, which is in series with the component, it is possible to determine the switching delay times in few nanoseconds time resolution.

However, the measurement of voltage over the parasitic inductance requires measurement electronics with high-speed components, such as comparators and isolators, in every IGBT module increasing the costs and complexity of the measurement.

BRIEF DESCRIPTION OF THE INVENTION

An object of the present invention is to provide a method and an apparatus for implementing the method so as to overcome the above problems. The objects of the invention are achieved by a method and an apparatus which are characterized by what is stated in the independent claims. The preferred embodiments of the invention are disclosed in the dependent claims.

The invention is based on the idea of determining the switching delay times on the basis of collector to emitter voltages. It has been noticed that by determining the switching delay times based on collector to emitter voltage, the turn-on and turn-off instants of parallel components can be made the same by employing the determined delays in the control of the components. When the determined switching delay times are taken into account in control, the collector to emitter voltages of the parallel components cross a certain voltage level substantially at the same time leading to substantially equally divided currents through the components.

An advantage of the method and apparatus of the invention is that the delay times can be obtained with a simple procedure which can be implemented with circuitry that does not require fast and costly components. The delay times can be further used in control of the components by delaying the switching pulses according to the determined delay times such that the currents through the parallel components are divided evenly during the switching procedure.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
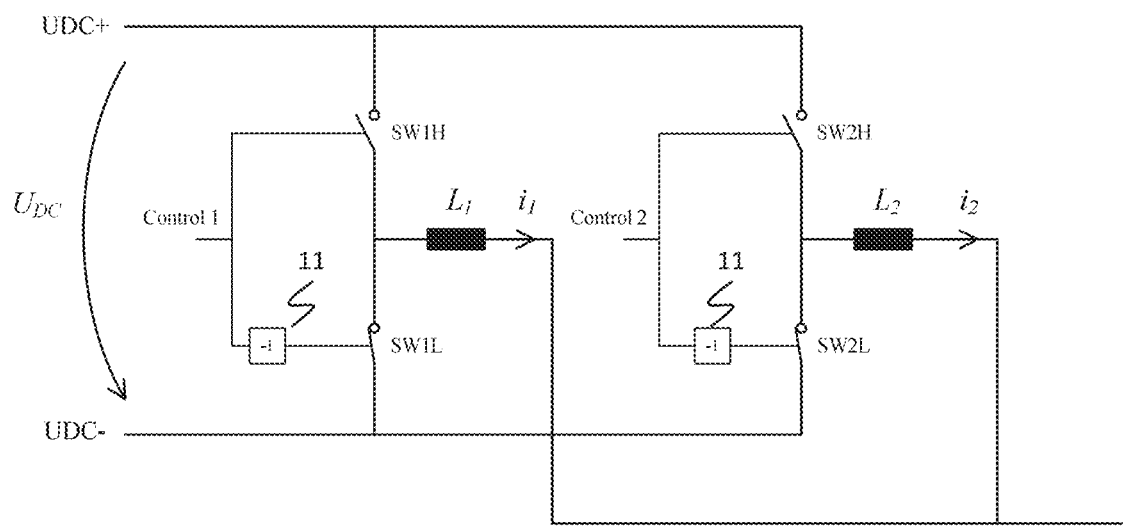
FIG. 1 shows a circuit with parallel half bridge legs.

FIG. 1 represents a circuit in which two half bridge legs are connected in parallel. First half bridge leg consists of an high-side switch SW1H and a low-side switch SW1L. Correspondingly, second half bridge leg has switches SW2H and SW2L. Both legs are connected in the intermediate voltage circuit between positive UDC+ and negative UDC- voltage rails having a voltage UDC between the rails.

The high-side and low-side switches are controlled complementarily meaning that either the high-side or low-side switch is conducting while the other switch is blocking. This is represented in FIG. 1 by inverting blocks 11. FIG. 1 shows further control signals Control 1, Control 2 which in the example provide switching instructions for the ideal switches of the parallel half bridge legs. The parallel legs are controlled with the same switching instructions which in case of ideal switches of FIG. 1 means that Control 1 and Control 2 are similar and the inverting blocks 11 invert the signals for the complementary switches.

In actual systems in which power semiconductor switch components are controlled, a gate control signal is provided to a gate driver circuit connected to the controlled component. The gate control signal is a signal originating from a modulator or similar controller which provides turn-on and turn-off commands to switch components. The gate driver amplifies the gate control signal and produces suitable gate voltages and gate currents to the controlled component for turning the component on or off as instructed.

Once the gate driver receives the gate control signal, it produces a gate to emitter voltage to the component for controlling the component according to the gate control signal. The component then changes its state according to the control.

As known, the state of the component is not changed instantly after the gate control signal is produced. The communication path comprises some delay between the modulator and the gate driver and the switching behaviour of the controlled component has inherent delays before it reaches fully conducting or fully blocking state.

Figure 2:
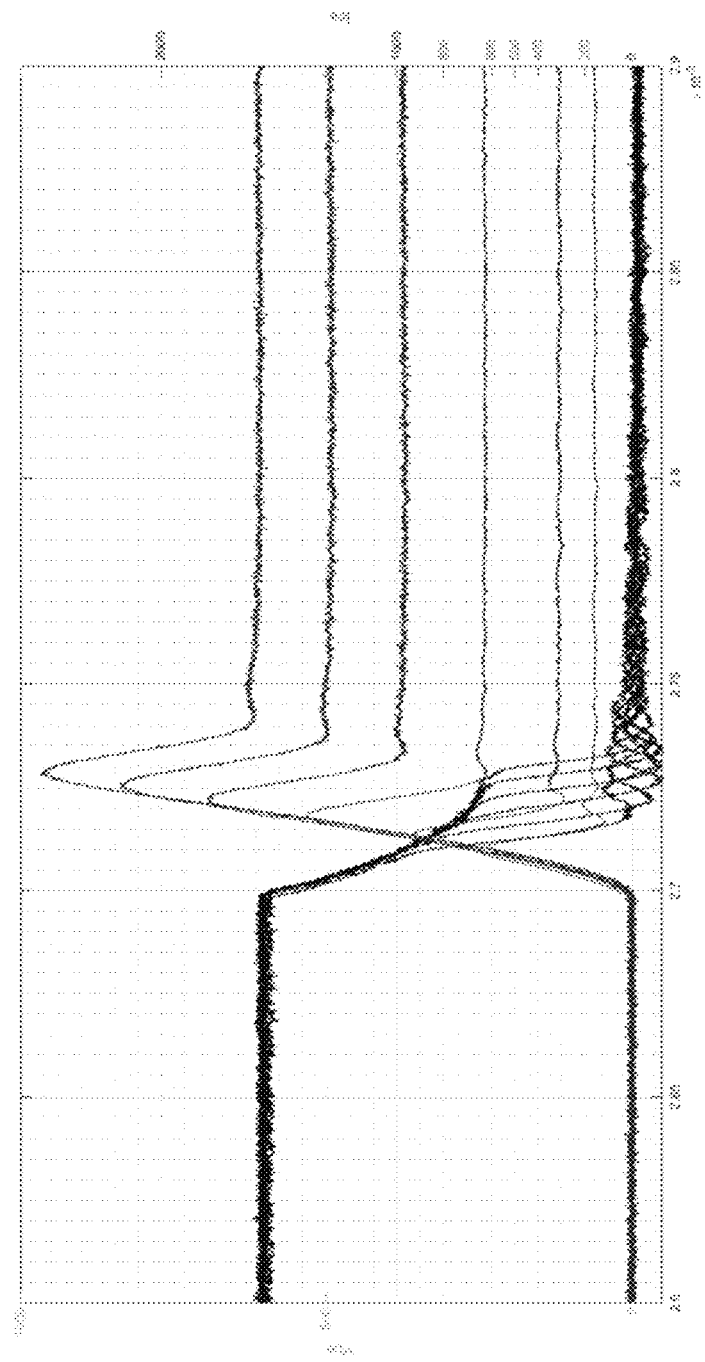
FIGS. 2 and 3 show turn-on waveforms of IGBT switches.
Figure 3:
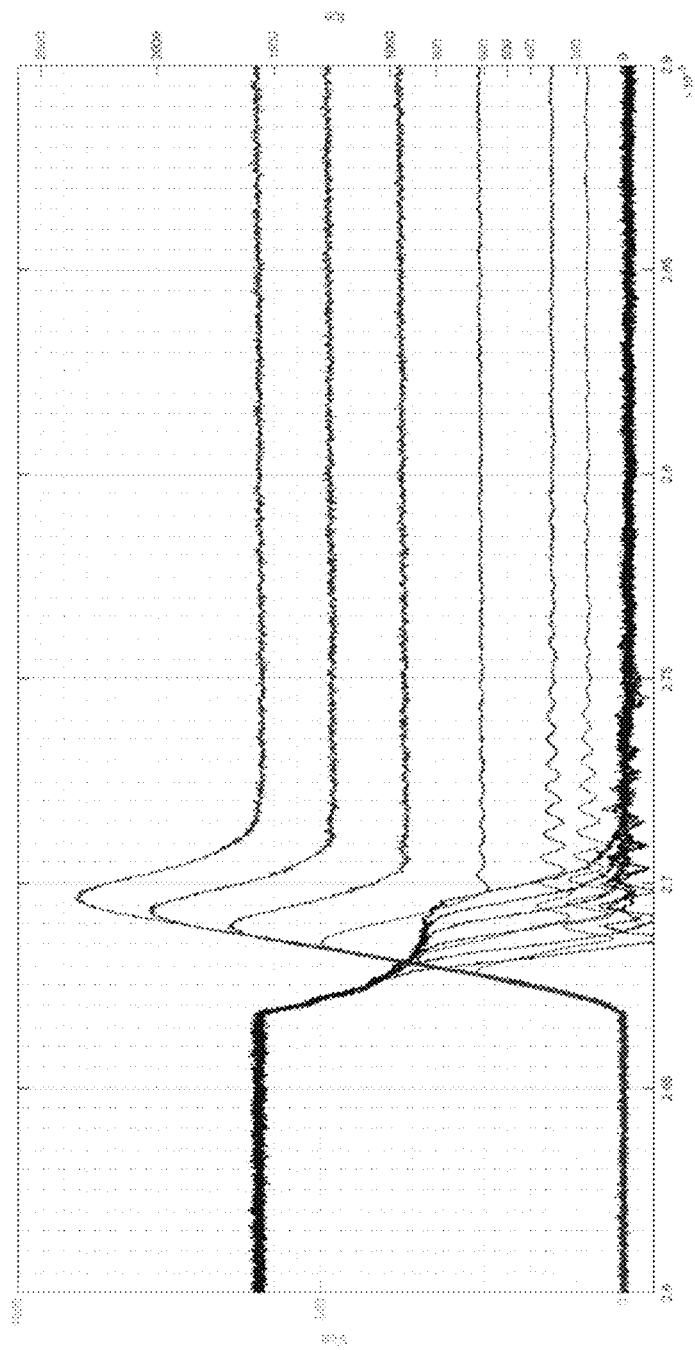

FIG. 2 shows an example of turn-on waveforms of an IGBT component with different output currents and FIG. 3 shows an example of turn-on waveforms of another IGBT component. The control of the components is similar in both FIGS. 2 and 3. In both FIGS. 2 and 3 the waveform is recorded starting from the gate control signal and by comparing the FIGS. 2 and 3 it can be seen that the IGBT component of FIG. 3 turns on approximately 300 ns faster than the IGBT component of FIG. 2. It is also noticed from FIGS. 2 and 3 that turn-on delay time does not change much as a function of the load current.

Figure 4:
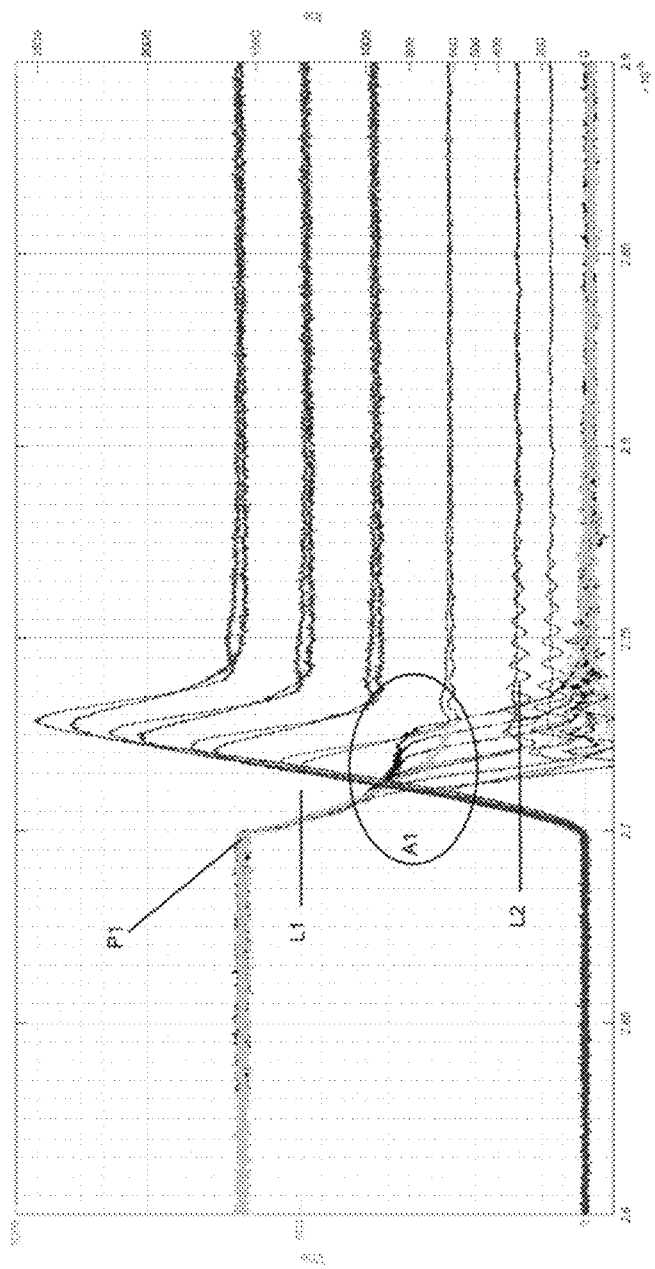
FIG. 4 shows the waveforms of FIGS. 2 and 3 together.

FIG. 4 shows the waveforms of FIGS. 2 and 3 in a same plot with the waveforms of FIG. 3 shifted by 300 ns such that the current slopes are aligned. When the current slopes are aligned, the collector to emitter voltages are also equal in certain parts of the voltage waveform. Thus by determining a certain level of the collector to emitter voltages of the parallel IGBTs, the switching delays of the components can be determined.

FIG. 4 shows a voltage level L1 in which the collector to emitter voltages are substantially equal while the current slopes are aligned. When this voltage level is applied to FIGS. 2 and 3, the time from the beginning of the graph, i.e. from the gate control signal, the delay times of the components can be determined as a time from the beginning of the gate control signal to the time when the collector to emitter voltage crosses the limit.

FIG. 4 shows also another voltage level L2 which can also be used in determining the delay times of the parallel components. It can be noticed that in the voltage level L2 the collector to emitter voltages are somewhat dependent on the load current of the component. However, with the same load current the collector to emitter voltages of the different components are substantially equal, and therefore the voltage level L2 is also suitable for determining delay times according to the above described principles.

FIG. 4 shows also a point P1 in which the collector to emitter voltages starts to collapse. This point P1 is substantially the same for all load currents and for different components when the current slopes are aligned. Thus by detecting the collapse point of the collector to emitter voltage, the delay times of the components can be determined. The collapse of the voltage can be determined by taking a time derivative of the collector to emitter voltage. When the time derivative of the voltage exceeds a set value it is considered that point P1 is reached. The time derivative can be calculated as a change of voltage between the voltage samples obtained from the collector to emitter voltage. When the change of voltage between samples is high enough, it is considered that point P1 is reached.

Specific area A1 is shown in FIG. 4. In area A1 the aligning of collector to emitter voltages does not result in alignment of current slopes with different load currents. Therefore, the voltage level used in determining the delay times should not be situated in the voltage range of area A1.

Figure 5:
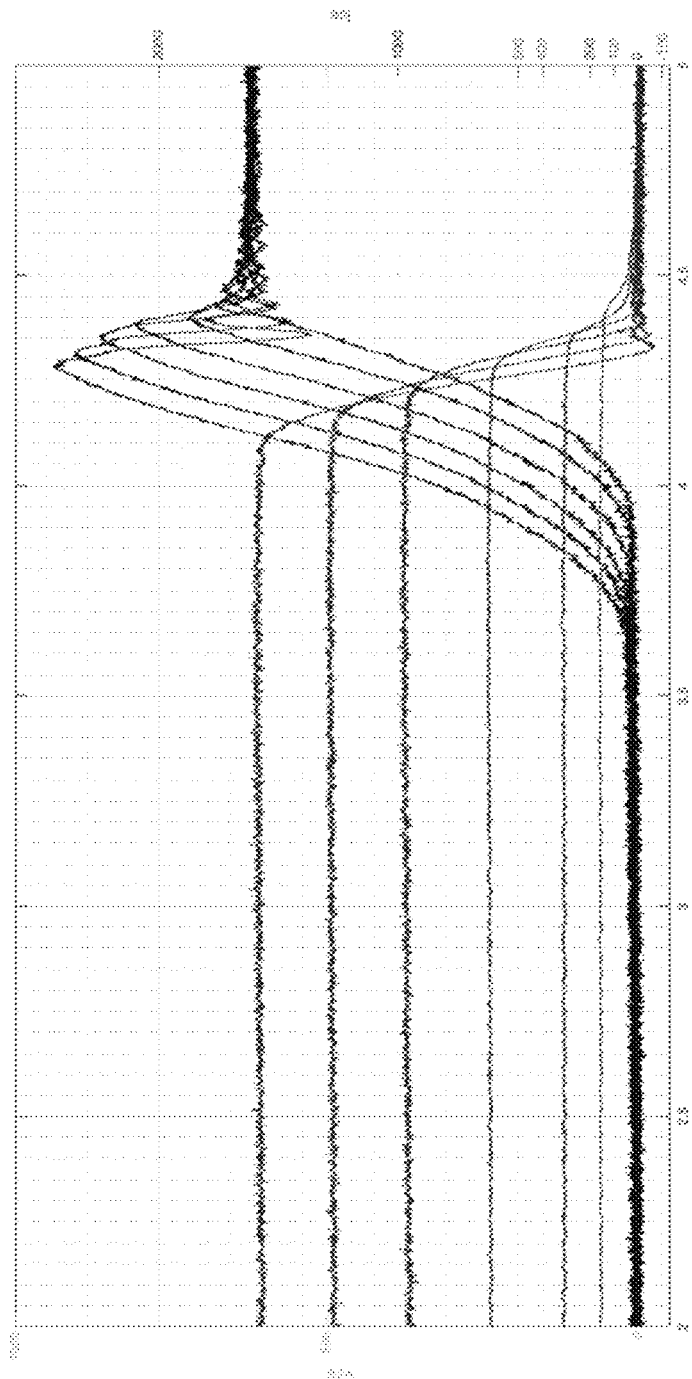
FIGS. 5 and 6 show turn-off waveforms of IGBT switches.
Figure 6:
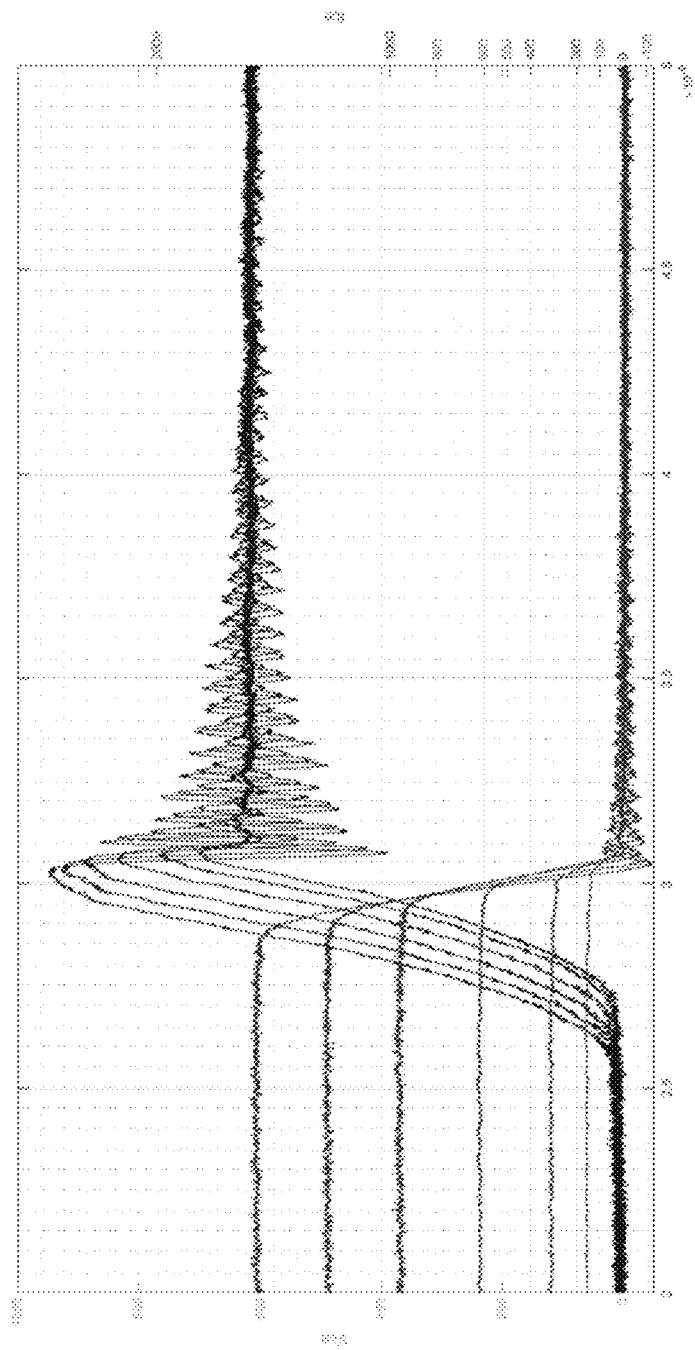

FIG. 5 shows turn-off behaviour of a certain IGBT component with differing load currents and FIG. 6 shows corresponding turn-off behaviour of another IGBT component. The plots of FIGS. 5 and 6 are obtained similarly as in connection with FIGS. 2 and 3, i.e. the start of the plot corresponds to the start of the gate control signal. By comparing FIGS. 5 and 6, it can be seen that the switch used in FIG. 6 turns off approximately 1.3 μs faster than the one in FIG. 5. It is also shown in the FIGS. 5 and 6 that the load current affects the delay time of the component. Therefore for current edge alignment the suitable locations in collector to emitter voltage must be carried out with same load currents.

Figure 7:
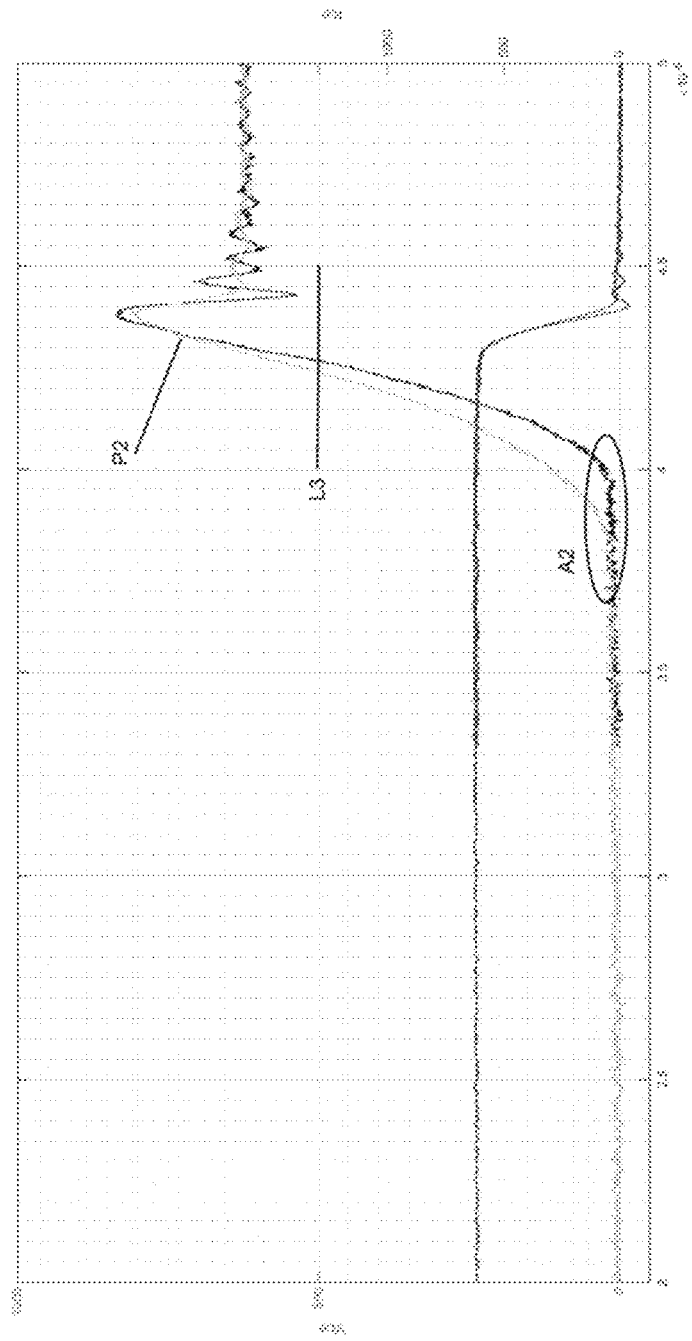
FIG. 7 shows turn-off waveforms form FIGS. 5 and 6 with a certain output current.
Figure 8:
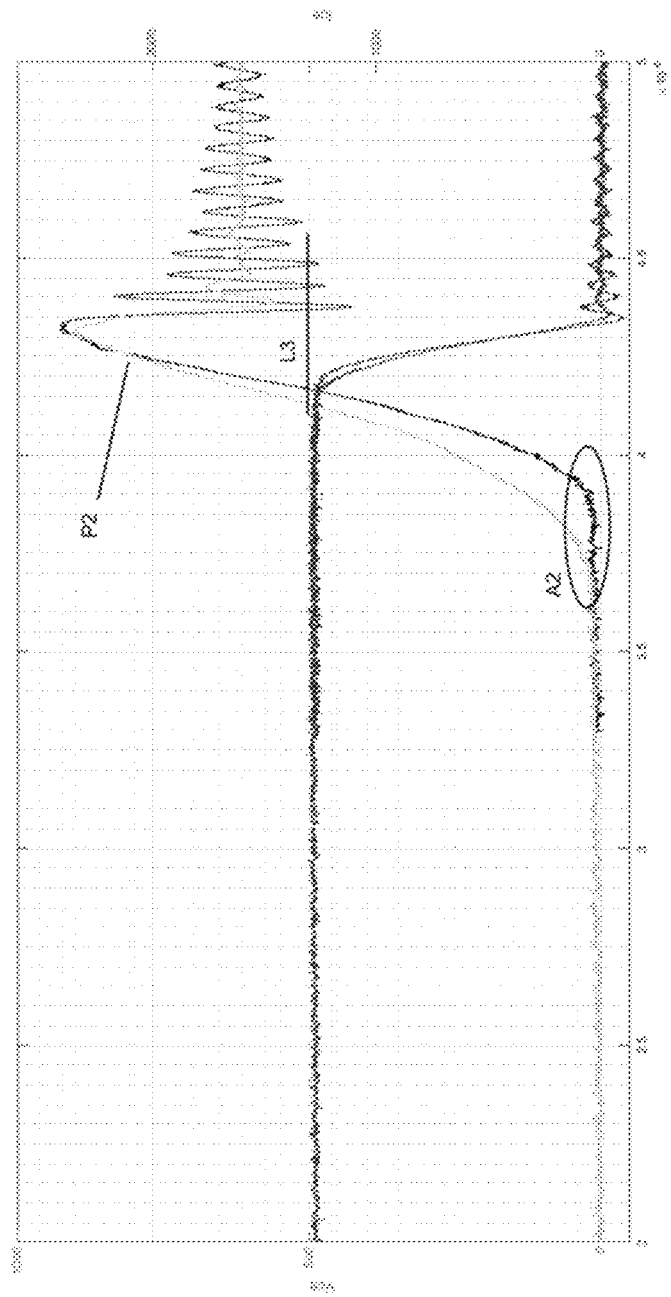
FIG. 8 shows turn-off waveforms form FIGS. 5 and 6 with another output current.

FIG. 7 shows turn-off behaviour of FIGS. 5 and 6 with load current of 600 Amperes when current edges are aligned. The collector to emitter voltages are not completely aligned, but when the voltages rise higher the alignment gets better. FIG. 8 shows similarly aligned currents with load current of 1200 Amperes, and the collector to emitter voltages are closer to each other in the higher range of voltages. In FIGS. 7 and 8 the optimal location of collector to emitter voltage in this case is marked as P2. Theoretically it equals to the voltage of the intermediate circuit $U_{DC}$. A voltage level L3 is indicated which can serve as a level for determining the delay times as in connection with turn-on of the switch component. Also indicated in FIGS. 7 and 8 are areas A2 in which it is shown that the beginning of voltage rises are not aligned when the currents slopes are aligned.

According to the method of the invention for determining switching delay times of power semiconductor switch components in parallel connected half bridge legs in which two or more power semiconductor switches are controlled in parallel, a gate control signals are provided to gate drivers of the parallel connected power semiconductor switch components.

As mentioned above, the gate control signal is provided from a modulator or similar controller, and as a response to the gate control signal, the switch component is controlled using respective gate driver.

Further in the method the collector to emitter voltages of the parallel connected power semiconductor switch components are determined. The collector to emitter voltages are the voltages over the components. The voltage can be determined by measuring it with means conventional in the art.

The method further comprises determining separate delay times for each of the parallel connected power semiconductor switch components based on the time instant of the gate control signal and the determined collector to emitter voltages or time derivatives of the determined collector to emitter voltages.

As explained above with reference to drawings, for each parallel switch component a delay time is determined as a time period from the beginning of the gate control signal to a time instant in which the determined collector to emitter voltage crosses a certain voltage limit or in which the time derivative of the collector to emitter voltage changes. The beginning of the gate control signal means the time instant when the gate control signal changes it state or when the control of the component is initiated.

The voltage limit is preferably set as a certain portion or percentage of the voltage of the intermediate circuit. The upper voltage limit is preferably higher than or equal to 50% of the voltage of the intermediate circuit UDC. The lower voltage limit is preferably in the range between 0% to 50% of voltage of the intermediate circuit. More preferably the upper voltage limit is in the range between 70% and 100% of the intermediate circuit voltage UDC, and the lower voltage limit between 0% and 30% of the intermediate circuit voltage UDC.

The voltage limit L1 presented in FIG. 4 is situated in the range between 70% . . . 100% of UDC whereas limit L2 is in the range between 0% . . . 30% of UCD. The voltage limit L3 presented in FIGS. 7 and 8 is also in the range between 70% . . . 100% of UDC.

According to preferred embodiment of the invention, the voltage limit used in the method is in the upper range i.e. between 50% . . . 100% of UDC. When voltage in the mentioned range is selected as voltage limit, the same limit is applicable both in turn-on and turn-off procedures for determining delay times.

Modulator produces turn-on and turn-off gate control signals. When the change of state of the controlled component is desired, a timer is set or the time instant of the start of the gate control signal is stored. Once the collector to emitter voltage of the component crosses the limit as explained above, the elapsed time is determined and stored. As the procedure is carried out for each parallel switch component, the time difference between the switching instants is obtained.

The obtained delay times or time differences are preferably employed in correcting the timings of the gate control signals such that simultaneous turn-on and turn-off procedures are obtained for the parallel components. Separate delay times are calculated for each parallel switch component and both for turn-on and turn-off.

Figure 9:
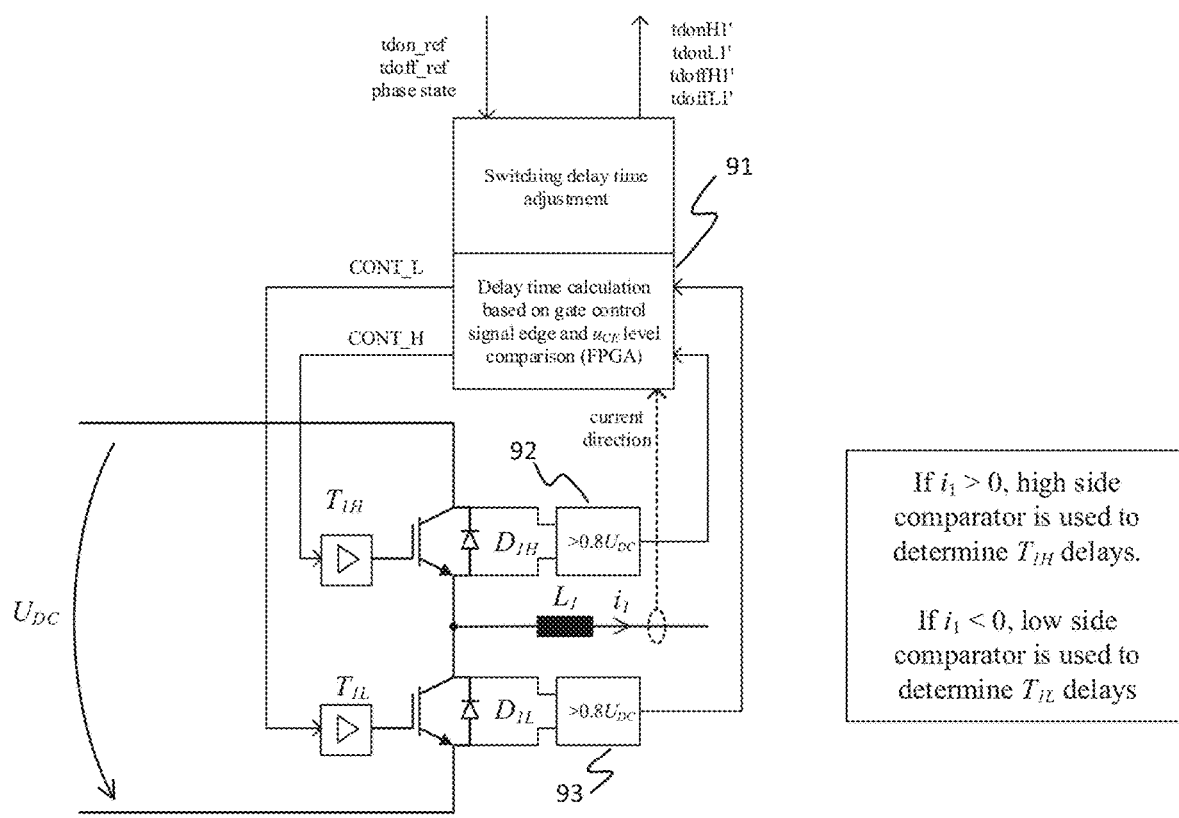
FIGS. 9, 10 and 13 show block diagrams for implementing embodiments of the invention.

FIG. 9 shows an implementation of the measurement of delay times together with an implementation of using the measured delay times in compensating the delays between parallel inverter legs.

The voltages over the high-side and low-side switch components are compared with a limit value which is selected to be 0.8 $U_{DC}$. The delay times are calculated in block 91 based on the gate control signal edge and level comparison. Block 91 both produces the gate control signal and receives the output from level comparing elements 92, 93. The determined delay times tdonH1', tdonL1', tdoffH1', tdoffL1' are sent to an upper level controller together with determined corresponding delay times from parallel switch components.

The upper level controller identifies the slowest of the delay times relating to each switching operation and parallel component i.e. turn-on delay times of parallel components are compared and turn-off delay times of parallel components are compared. Based on the comparison the upper level controller adjusts the turn-on and turn-off times such that the different delays are taken into account. The upper level control system comprises also the modulator which forms the pulses for the inverter, and the pulses are adjusted according to the determined delays. In FIG. 9 the modulator output signal is represented as 'phase state' signal entering the block 91.

Based on the comparison of the delay times, the upper level control system may provide control delays to each parallel inverter leg. The control delays tdon_ref, tdoff_ref are used in block 91 for delaying the switching operations. FIG. 9 shows only one of the parallel inverter legs, and the upper control system is common to all the parallel legs. Based on the determined delays, the upper control system sends control delay references to each of the parallel inverter legs such that the delays of the components are compensated. The control delays are taken into account in gate control signals CONT_L, CONT_H which are sent to gate drivers T1H, T1L.

The turn-on and turn-off delay times may also be provided as discrete times from the upper controller. Such discrete time instants require that each of the controllers in the parallel legs has a clock or time signal that is synchronised between the parallel legs.

FIG. 9 also shows that the direction of the output current ii of the inverter leg is determined. The information of direction is required to define which switch delays are determined. When the current is positive, the delay time measurement and compensation of high-side switch is performed. In turn, when the current is negative, the same procedure is done for the low-side switch.

Figure 13:
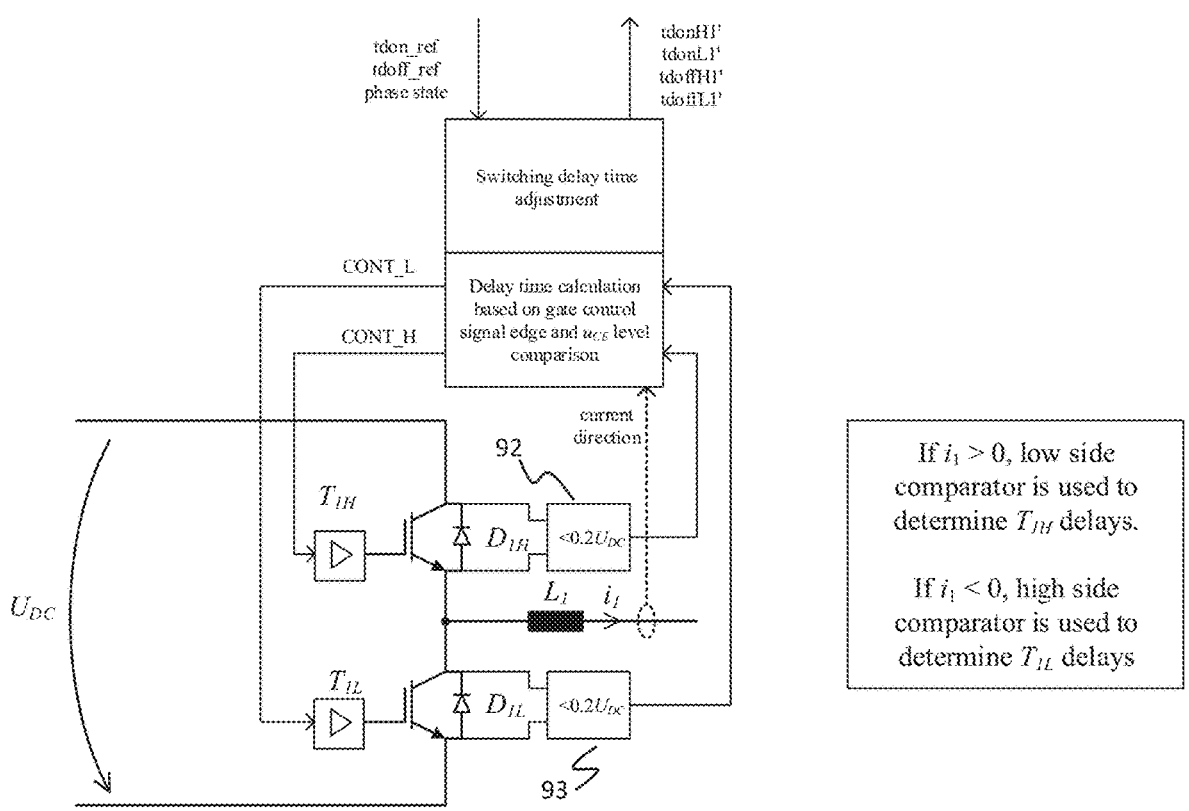

FIG. 13 corresponds to FIG. 9 which the exception that comparison level is different in the comparing elements 92, 93. When compared to the embodiment of FIG. 9, the delay time are determined complementarily in the embodiment of FIG. 13.

Figure 10:
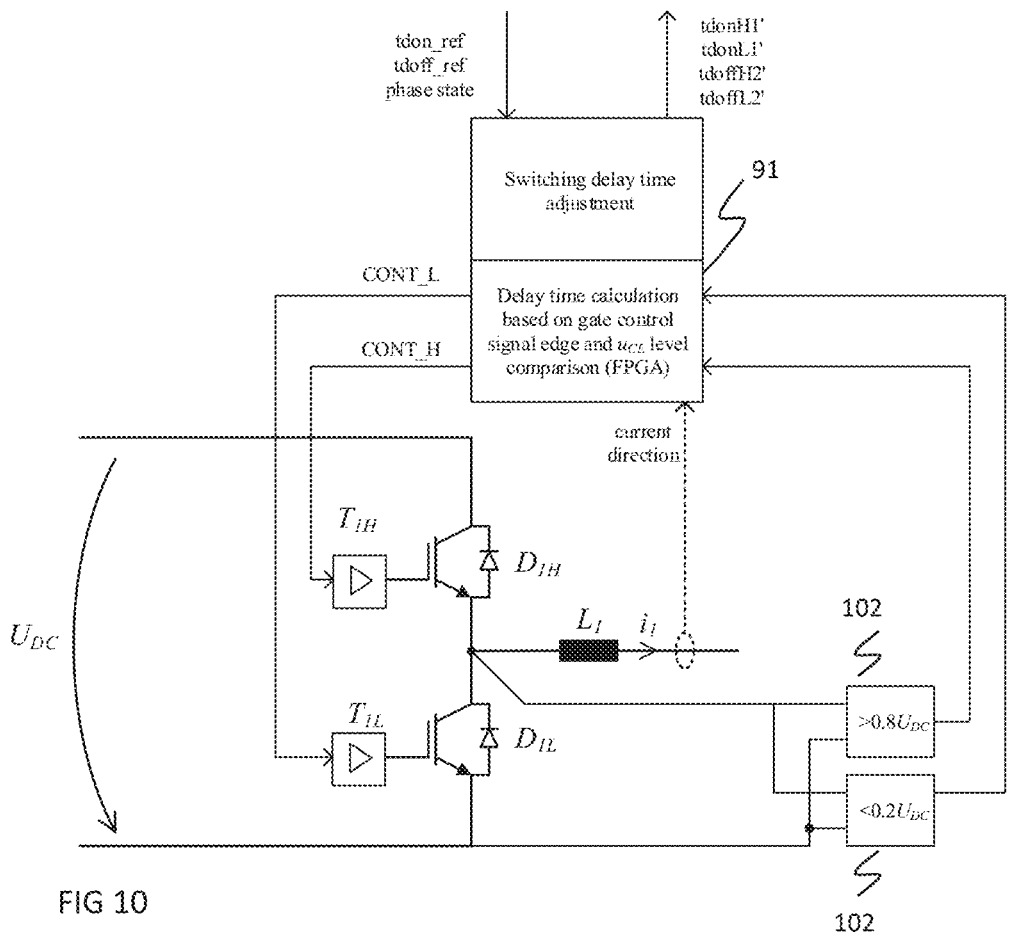

FIG. 10 shows an implementation on the invention in which the middle point voltage of the half-bridge, referred to UDC−, is measured and compared to 80% and 20% of the intermediate circuit voltage UDC with comparators 101, 102. The direction of load current $i_1$ defines which IGBT delay is calculated and which comparator is used. When the current is positive, the delays of high-side IGBT are calculated and 20% comparator is used. If the current is negative, the delays of the low-side IGBT are calculated and 80% comparator is used. In the embodiment of FIG. 10 only the collector to emitter voltage of the low-side switch component is measured. The collector to emitter voltage of the high-side switch component U_SW_H can be calculated based on DC voltage $U_{DC}$ and the voltage of the low-side switch component U_SW_L as U_SW_H=$U_{DC}$−U_SW_L.

Figures 11A, 11B:
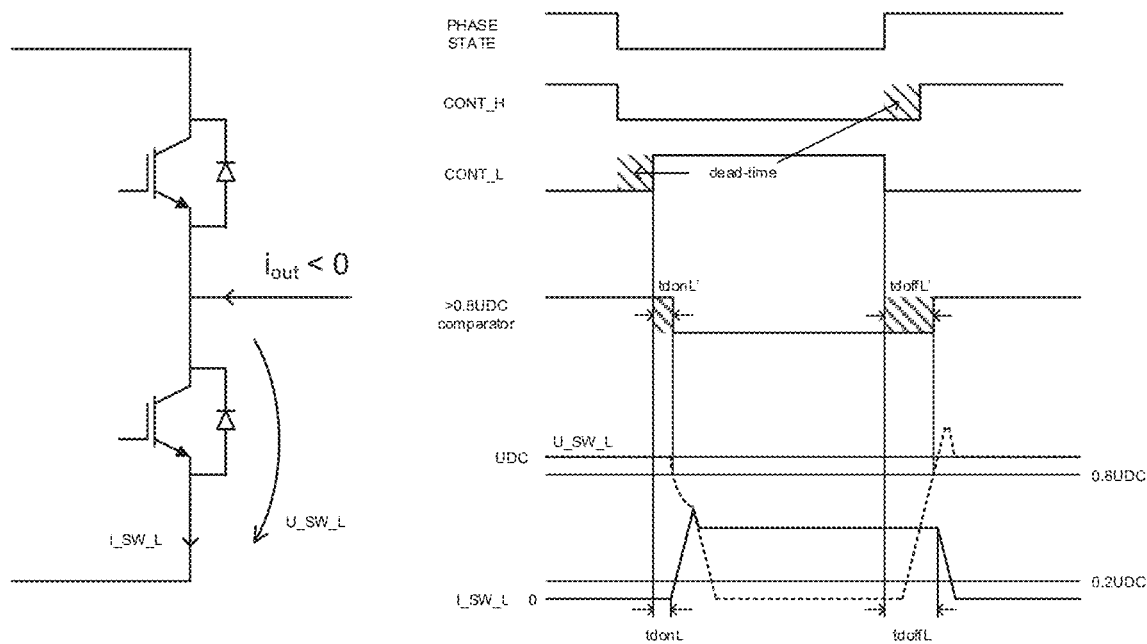
FIGS. 11A and 12A show current directions and voltages in an inverter leg.
FIGS. 11B and 12B show examples of current and voltage waveforms in connection with the embodiment of FIG. 10.

FIG. 11A shows the direction of negative current tout and the measured voltage U_SW_L and the current through the component I_SW_L and FIG. 11B shows waveforms in connection with determining the delay times of the low-side switch component.

FIG. 11B shows phase state signal originating from the upper level controller. Phase state signal is the signal that is originating from the modulator and the switches of the half-bridge are controlled according to the phase state signal. When phase state signal is low, the low-side switch component is active. Signal CONT_H and CONT_L are the signal sent to the high-side gate driver and low-side gate driver respectively. The signals to the gate drivers show how a dead time is usually inserted in signal prior to each turn-on command such that the opposite switch device has turned off prior to turn on of the other component.

FIG. 11B shows further the voltage over the low-side switch component U_SW_L which is compared with the limit value of 0.8*UDC. Further, the comparator 101 output is also shown and the obtained delay times tdonL', tdoffL'. It is to be noted, that the calculation of the delay time tdonL' begins when the gate control signal CONT_L is set to active state.

Similarly as in FIG. 9, FIG. 10 shows how upper control system sends together with phase state information the used control delay references tdon_ref, tdoff_ref. The provided control delays are used for compensating the calculated delays by delaying the gate control signals.

Figure 12A:
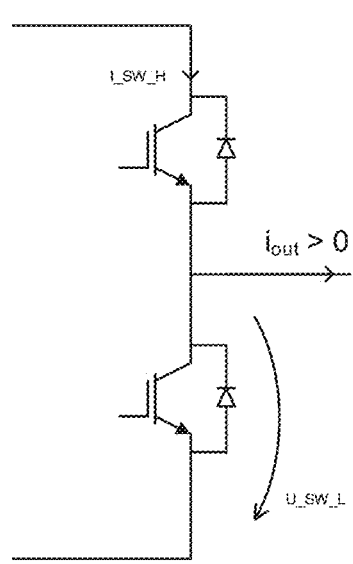
Figure 12B:
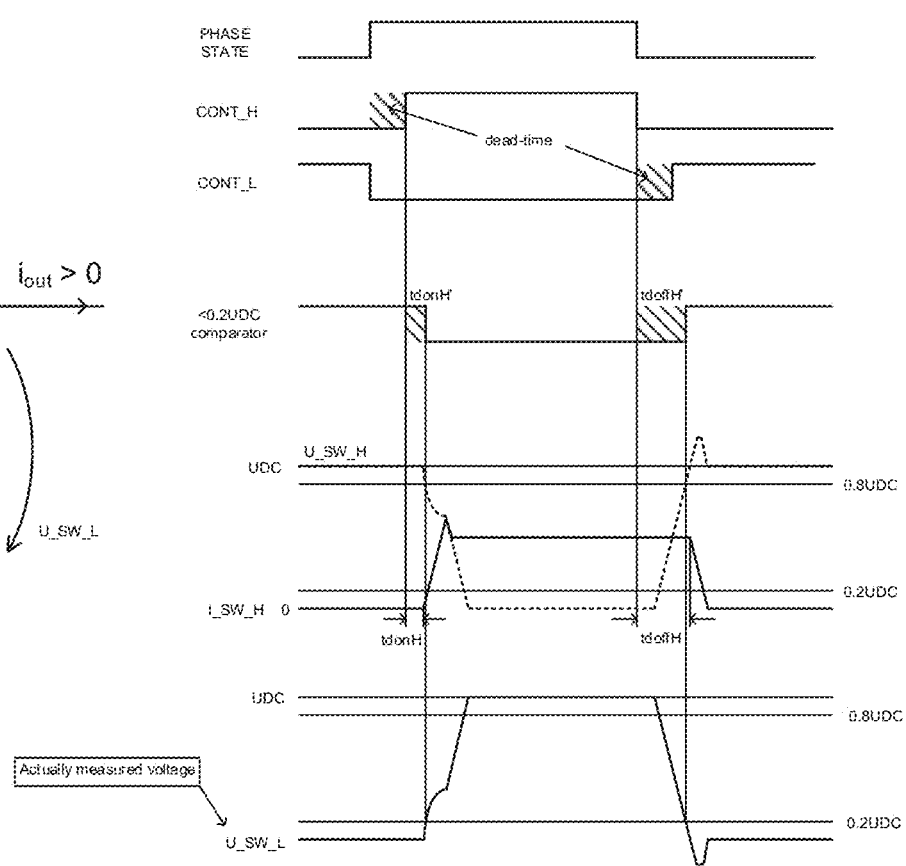

FIG. 12A shows the voltage over the low-side switch component of a half-bridge leg when output current tout is positive. FIG. 12B shows the same signals as in FIG. 11B when output current is positive and the high-side switch switches the current. As shown in FIG. 10, two comparators are used in the embodiment depending on the direction of the current. In case of positive current, comparator 102 is employed and it compares the voltage over the low-side switch to a limit which is 0.2*UDC. The lowest plot of FIG. 12B shows the actual measured voltage over the low-side switch component. As presented above, the voltage over the high-side component equals to difference between DC intermediate circuit and the voltage over the low-side component. This voltage over the high-side component is shown also in FIG. 12B. When the voltage over the low-side component is compared with the limit of 20% of UDC it equals that of comparing the voltage over the high-side switch with the limit of 80% of UDC. Thus in the embodiment, the collector to emitter voltage of the low-side switch component is compared with first voltage limit when determining the delay times relating to the low-side component and with the second voltage limit when determining the delay times relating to the high-side component. The voltage limits are preferably portions of the voltage of the intermediate voltage circuit such that a first portion defines the first voltage limit and a second portion defines the second voltage limit. The sum of the first and second portion equals one. In the above example the voltage limit is set to 80% of UDC, and therefore the first portion is 80%, second portion is 20% and the sum of the first and second portion equals to 100% which is one.

The output of comparator 102 is shown in the plots of FIG. 12B. It is further shown how the control delays tdonH' and tdoffH' are determined as time periods between the edge of the gate control signal CONT_H and the comparator output state change.

FIGS. 1, 9 and 10 show an inductance $L_1$, $L_2$ connected to the output of the phase leg. The parallel connection of the inverter legs is typically carried out with such inductors. The inductors help in balancing the currents between the inverter legs and provide phase voltage du/dt filtering. If the current paths of the parallel legs are completely without inductance, the voltages over the parallel switch components would be the same. Depending on the case, the inherent inductances in the physical system might be enough for decoupling of the voltages and additional inductors are not necessarily required for the operation of the invention.

The method of the invention is preferably used repeatedly during the use of the device in which the method is implemented. When the method is implemented in a frequency converter having parallel inverter legs, the method is repeated during the control of the actual load of the device. When the switch components are operated using the control delays obtained with the method of the invention, the time delays are still calculated and new control delays are provided for each switching instant.

The present invention relates also to use of the determined delay times in control of the parallel connected inverter legs for synchronizing the switching instants of the parallel inverter legs as described above. For each switch component of each parallel connected inverter leg turn-on and turn-off delay times are determined. The delay times are compared in an upper control system and gate control signals are delayed in such a manner, that the currents of the parallel components rise and fall substantially simultaneously.

The present invention relates also to an apparatus for determining switching delay times of power semiconductor switch components in parallel connected half bridge legs in which two or more power semiconductor switches are controlled in parallel. The apparatus comprises means adapted to provide a gate control signal to gate drivers of the parallel connected power semiconductor switch components.

Further, the apparatus comprises means adapted to determine collector to emitter voltages of the parallel connected power semiconductor switch components and to determine separate delay times for each of the parallel connected power semiconductor switch components based on the time instant of the gate control signal and the determined collector to emitter voltages or time derivatives of the determined collector to emitter voltages.

The apparatus is preferably implemented as an inverter or a frequency converter which is constituted of parallel connected inverter modules which are controlled with same switching instructions. Such a device comprises also an upper control system which provides the switching instructions to the inverter bridges for producing a desired output voltage. The upper control system also calculates and produces switching instructions and control delays for each parallel leg such that the delays of the parallel legs are taken into account and synchronous operation is obtained. The upper control system is produced preferably from an inverter or a frequency converter operating as a master device. The delay time calculation may be implemented as a FPGA circuit for fast processing of the calculation.

It will be obvious to a person skilled in the art that, as the technology advances, the inventive concept can be implemented in various ways. The invention and its embodiments are not limited to the examples described above but may vary within the scope of the claims.

The invention claimed is:

1. A method for determining switching delay times of power semiconductor switch components in parallel connected half bridge legs in which two or more power semiconductor switches are controlled in parallel, the method comprising:
   providing a gate control signal to gate drivers of the parallel connected power semiconductor switch components;
   determining collector to emitter voltages of the parallel connected power semiconductor switch components;
   determining separate delay times for each of the parallel connected power semiconductor switch components based on the time instant of the gate control signal and the determined collector to emitter voltages or time derivatives of the determined collector to emitter voltages;

wherein the determining of the separate delay times comprises:
  setting a voltage limit,
  comparing collector to emitter voltages of the parallel connected power semiconductor components with the voltage limit, and
  determining separate delay times for each of the parallel connected power semiconductor switch components as a time period from the gate control signal to the instant when the collector to emitter voltage crosses the voltage limit;

wherein the parallel connected half bridge legs are connected in a DC intermediate circuit and the setting the voltage limit comprises:
  determining voltage of the DC intermediate circuit, and
  setting the voltage limit as a proportion of the voltage of the DC intermediate circuit; and wherein the collector to emitter voltage of a low-side power semiconductor switch component is compared with the voltage limit for obtaining delay times for both low-side and high-side power semiconductor switch component.

2. The method according to claim 1, wherein the upper voltage limit for determining turn-on delay times is in the range of 50% to 100% of the voltage of the DC intermediate circuit, or wherein the lower voltage limit for determining turn-on delay times is in the range of 0% to 50% of the voltage of the DC intermediate circuit.

3. The method according to claim 1, wherein the voltage limit for determining turn-off delay times is in the range of 50% to 100% of the voltage of the DC intermediate circuit.

4. The method according to claim 1, wherein the collector to emitter voltage of a low-side power semiconductor component is compared with a first voltage limit that is a first portion of the DC voltage of the intermediate voltage circuit for obtaining the delay time for the high-side power semiconductor switch component and with a second voltage limit that is a second portion of the DC voltage if the intermediate voltage circuit for obtaining the delay time for the low-side power semiconductor switch component.

5. The method according to claim 1, wherein time derivatives of the collector to emitter voltages are used in connected with determining turn-on delay times, and delay time is determined as the time period between the time instant of the gate control signal and a time instant in which the collector to emitter voltage starts decreasing.

6. An apparatus for determining switching delay times of power semiconductor switch components in parallel connected half bridge legs in which two or more power semiconductor switches are controlled in parallel, the apparatus comprising:

a controller generating a gate control signal to gate drivers of the parallel connected power semiconductor switch components;

the controller determining collector to emitter voltages of the parallel connected power semiconductor switch components and determining separate delay times for each of the parallel connected power semiconductor switch components based on the time instant of the gate control signal and the determined collector to emitter voltages or time derivatives of the determined collector to emitter voltages;

wherein the determining of the separate delay times comprises:
  setting a voltage limit,
  comparing collector to emitter voltages of the parallel connected power semiconductor components with the voltage limit, and
  determining separate delay times for each of the parallel connected power semiconductor switch components as a time period from the gate control signal to the instant when the collector to emitter voltage crosses the voltage limit;

wherein the parallel connected half bridge legs are connected in a DC intermediate circuit and the setting the voltage limit comprises:
  determining voltage of the DC intermediate circuit, and
  setting the voltage limit as a proportion of the voltage of the DC intermediate circuit; and wherein the collector to emitter voltage of a low-side power semiconductor switch component is compared with the voltage limit for obtaining delay times for both low-side and high-side power semiconductor switch component.

7. The apparatus according to claim 6, wherein the apparatus is an inverter or a frequency converter.

8. The method according to claim 2, wherein the voltage limit for determining turn-off delay times is in the range of 50% to 100% of the voltage of the DC intermediate circuit.

9. The method according to claim 1, wherein the upper voltage limit for determining turn-on delay times is in the range of 70% to 100% of the voltage of the DC intermediate circuit or wherein the lower voltage limit for determining turn-on delay times is in the range of 0% to 50% of the voltage of the DC intermediate circuit.

10. The method according to claim 1, wherein the voltage limit for determining turn-off delay times is in the range of 70% to 100% of the voltage of the DC intermediate circuit.

11. The method according to claim 2, wherein the lower voltage limit for determining turn-on delay times is in the range of 0% to 50% of the voltage of the DC intermediate circuit.

12. The method according to claim 1, wherein the lower voltage limit for determining turn-on delay times is in the range of 0% to 30% of the voltage of the DC intermediate circuit.

* * * * *